United States Patent
Ivanov et al.

(10) Patent No.: US 9,929,142 B2
(45) Date of Patent: Mar. 27, 2018

(54) APPARATUS AND METHODS FOR OVERVOLTAGE SWITCHES WITH ACTIVE LEAKAGE CURRENT COMPENSATION

(71) Applicant: Analog Devices, Inc., Norwood, MA (US)

(72) Inventors: Evgueni Ivanov, Lexington, MA (US); Javier Alejandro Salcedo, North Billerica, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 332 days.

(21) Appl. No.: 14/638,880

(22) Filed: Mar. 4, 2015

(65) Prior Publication Data

US 2016/0261110 A1   Sep. 8, 2016

(51) Int. Cl.
  *H02H 9/04*   (2006.01)
  *H01L 27/02*  (2006.01)
  *H01L 29/735* (2006.01)
  *H01L 29/06*  (2006.01)

(52) U.S. Cl.
  CPC ...... *H01L 27/0262* (2013.01); *H01L 29/0692* (2013.01); *H01L 29/735* (2013.01)

(58) Field of Classification Search
  CPC .......... H02H 9/046; H02H 9/04; H02H 9/041; H01L 27/0262
  USPC .......................................................... 361/56
  See application file for complete search history.

(56) References Cited

U.S. PATENT DOCUMENTS

| | | | |
|---|---|---|---|
| 5,547,887 A | 8/1996 | Brown et al. | |
| 6,671,153 B1 | 12/2003 | Ker et al. | |
| 7,995,316 B2 | 8/2011 | Carpenter, Jr. et al. | |
| 8,441,305 B2 | 5/2013 | Shih | |
| 8,466,489 B2 | 6/2013 | Salcedo et al. | |

(Continued)

FOREIGN PATENT DOCUMENTS

| | | |
|---|---|---|
| CN | 105938831 A | 9/2016 |
| DE | 10201603865 A1 | 9/2016 |
| EP | 0 753 892 B1 | 4/2002 |

OTHER PUBLICATIONS

Salcedo, J.A.; Hajjar, J.-J.; Malobabic, S.; Liou, J.J., "Bidirectional Devices for Automotive-Grade Electrostatic Discharge Applications," in IEEE Electron Device Letters, vol. 33, No. 6, pp. 860-862, Jun. 2012.

(Continued)

*Primary Examiner* — Dharti Patel

(74) *Attorney, Agent, or Firm* — Knobbe, Martens, Olson & Bear, LLP

(57) ABSTRACT

Apparatus and methods for overvoltage switches with active leakage current compensation are provided. In certain configurations, an IC includes an input node and a protection device or overvoltage switch electrically connected to the input node. The protection device includes a first well and a second well. The second well is positioned adjacent to the first well and has a conductivity type opposite that of the first well. Additionally, a first terminal of the protection device is electrically connected to the first well and to the input node of the IC. The protection device further includes a leakage current compensation circuit that is used to control a voltage level of the second well based on a voltage level of the first terminal to inhibit a leakage current of the first terminal of the protection device.

21 Claims, 7 Drawing Sheets

(56) References Cited

U.S. PATENT DOCUMENTS

| | | |
|---|---|---|
| 8,467,162 B2 * | 6/2013 | Wang .................. H01L 27/0262 361/111 |
| 8,498,085 B2 | 7/2013 | Altolaguirre et al. |
| 8,610,251 B1 | 12/2013 | Salcedo |
| 8,663,509 B2 | 3/2014 | Bar-Yaakov et al. |
| 8,680,620 B2 | 3/2014 | Salcedo et al. |
| 8,686,470 B2 | 4/2014 | Ritter |
| 2008/0029782 A1 | 2/2008 | Carpenter et al. |

OTHER PUBLICATIONS

Salcedo, J.A.; Liou, J.J.; Zhiwei Liu; Vinson, J.E., "TCAD Methodology for Design of SCR Devices for Electrostatic Discharge (ESD) Applications," in IEEE Transactions on Electron Devices, vol. 54, No. 4, pp. 822-832, Apr. 2007.

Salcedo, J.A.; Liou, J.J., "A novel dual-polarity device with symmetrical/asymmetrical S-type I-V characteristics for ESD protection design," in IEEE Electron Device Letters, vol. 27, No. 1, pp. 65-67, Jan. 2006.

Schlaepfer, Eric, "Overvoltage Protection (OVP) for Sensitive Amplifier Applications", Maxim Integrated, May 8, 2007, Application Note 4035, pp. 1-7.

* cited by examiner

APPARATUS AND METHODS FOR OVERVOLTAGE SWITCHES WITH ACTIVE LEAKAGE CURRENT COMPENSATION

BACKGROUND

Field

Embodiments of the invention relate to electronic systems, and more particularly, to overvoltage switches/protection devices for integrated circuits (ICs).

Description of the Related Technology

Certain electronic systems can be exposed to an overstress event, or an electrical signal of a relatively short duration having rapidly changing voltage and high power. Overstress events can include, for example, electrostatic discharge (ESD) events and/or electromagnetic interference (EMI) events.

Overstress events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, overstress events can induce latch-up (in other words, inadvertent creation of a low-impedance path), thereby disrupting the functioning of the IC and potentially causing permanent damage to the IC. Thus, there is a need to provide an IC with protection from overstress events without impacting its performance.

SUMMARY

In one aspect, an integrated circuit is provided. The integrated circuit includes an input node and a protection device. The protection device includes a first terminal electrically connected to the input node, a first well of semiconductor electrically connected to the first terminal, a second well of semiconductor adjacent to the first well, and a leakage current compensation circuit. The second well has a conductivity type opposite that of the first well. Additionally, the leakage current compensation circuit is configured to control a voltage level of the second well based on a voltage level of the first terminal to inhibit a leakage current of the first terminal of the protection device.

In another aspect, a method of electrical overstress protection is provided. The method includes protecting an input node of an integrated circuit from an overstress event using a protection device, the protection device including a first terminal electrically connected to the input node, a first well of semiconductor electrically connected to the first terminal, and a second well of semiconductor adjacent to the first well and of a conductivity type opposite that of the first well. The method further includes inhibiting a leakage current of the first terminal of the protection device by controlling a voltage level of the second well based on a voltage level of the first terminal using a leakage current compensation circuit.

In another aspect, an integrated circuit is provided. The integrated circuit includes an input node and a protection device. The protection device includes a first terminal electrically connected to the input node, a first well of semiconductor electrically connected to the first terminal, and a second well of semiconductor adjacent to the first well. The second well has a conductivity type opposite that of the first well. The protection device further includes a means for inhibiting for a leakage current of the first terminal of the protection device by controlling a voltage level of the second well based on a voltage level of the first terminal.

DETAILED DESCRIPTION OF EMBODIMENTS

Figure 1:
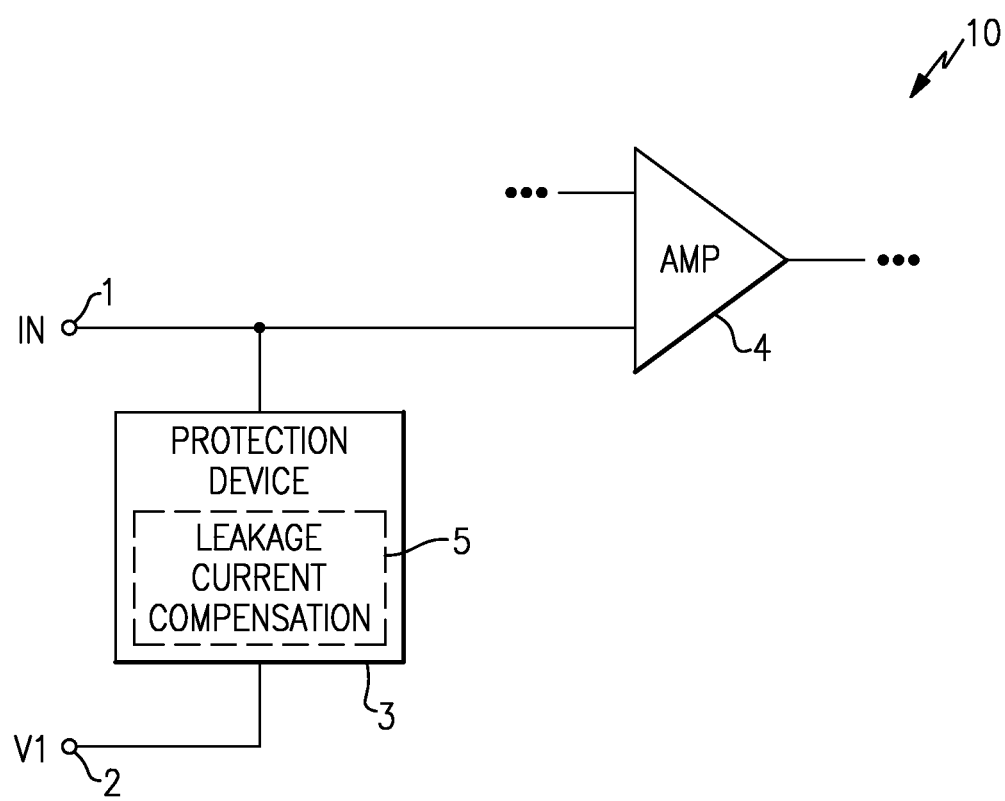
FIG. 1 is a schematic diagram of one embodiment of an integrated circuit.

The following detailed description of embodiments presents various descriptions of specific embodiments of the invention. However, the invention can be embodied in a multitude of different ways as defined and covered by the claims. In this description, reference is made to the drawings in which like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

Overview of Protection Devices with Active Leakage Current Compensation

To help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), the Automotive Engineering Council (AEC), and the International Organization for Standardization (ISO). The standards can cover a wide multitude of overstress events, including electrostatic discharge (ESD) events and/or electromagnetic interference (EMI) events. To meet such standards, an integrated circuit (IC) can include protection devices at the IC's pins or pads.

The protection devices can operate in an OFF or high impedance state when the IC's pins or pads are operating with normal signaling levels. However, when an overstress event causes the voltage across a particular protection device to exceed the device's forward or reverse trigger voltage, the protection device can activate and operate in an ON or low impedance state in which the protection device shunts a portion of the current and/or charge associated with the overstress event. Thus, the protection devices can be used to prevent the voltage level of the IC's pins or pads from reaching a failure voltage associated with damage to the IC.

As used herein, a protection device can also be referred to as an overvoltage switch. For example, the protection device can operate in the OFF or high impedance state when no overvoltage condition is present, and can switch on to operate in the ON or low impedance stage when an overvoltage condition is present.

Although including protection devices at the IC's pins or pads can help protect the IC from damage from overstress events, the protection devices may impact the IC's performance during normal operation. For example, even when in the OFF state, the protection devices may nevertheless have a finite input leakage current that can degrade the IC's performance. For instance, in one example, the IC can include a precision amplifier having an input electrically connected to a pin or pad of the IC. Additionally, when a protection device is also electrically connected to the pin or pad and has relatively high leakage current, the performance of the precision amplifier can be degraded. For example, the protection device's leakage current can undesirably increase the input bias current of the precision amplifier, particularly at high temperatures. In other examples, a protection device with relatively high leakage current can generate input offsets, systematic errors, and/or otherwise degrade the performance of precision circuitry of an IC.

Provided herein are apparatus and methods for protection devices with active leakage current compensation. In certain configurations, an IC includes an input node and a protection device electrically connected to the input node. The protection device includes a first well and a second well. The second well is positioned adjacent to the first well and has a conductivity type opposite that of the first well. Additionally, a first terminal of the protection device is electrically connected to the first well and to the input node of the IC. The protection device further includes a leakage current compensation circuit that is used to control a voltage level of the second well based on a voltage level of the first terminal to inhibit leakage current flowing into or out of the first terminal of the protection device.

A protection device with active leakage current compensation can advantageously provide both robust protection to a pin or pad of an IC from overstress events while having a minimal performance impact on circuitry coupled to the pin or pad.

The teachings herein can be used to reduce the leakage current of protection devices used in a wide variety of applications, including, for example, applications with stringent input current specifications. For example, a precision amplifier can be specified to operate at very low input bias current, as a reference, sub-nA ($10^{-9}$ A) bias currents in the range of 50 pA ($10^{-12}$ A) to 800 pA, for instance 200 pA, even at high temperatures (e.g., 125 C). By implementing a protection device with active leakage current compensation, the protection device can have a small or no impact on the operation of the precision amplifier. In contrast, a protection device with high input leakage current can degrade the performance of a precision amplifier by generating a temperature-dependent input bias current.

In certain configurations, the protection device comprises a bidirectional clamp, such as a bidirectional silicon controlled rectifier (SCR) device. Additionally, the bidirectional clamp further includes a third well of the same conductivity type of the first well. For example, the first and third wells can comprise p-wells, and the second well can comprise an n-well. The wells are configured such that at least a portion of the second well is positioned between the first and second wells. Additionally, the first p-well includes at least one P+ region electrically connected to the protection device's first terminal, and the second p-well includes at least one P+ region electrically connected to the protection device's second terminal. In such configurations, the leakage current compensation circuit can operate to control a base-to-emitter voltage of a PNP bipolar transistor having emitter, base, and collector regions associated with the first p-well, the n-well, and the second p-well, respectively. In particular, the leakage current compensation circuit can control the PNP bipolar transistor's base-to-emitter voltage to be about equal to 0 V to inhibit leakage current from flowing into or out of the protection device's first terminal.

In certain configurations, the leakage current compensation circuit includes a buffer having an input electrical connected to the first terminal and an output that controls a voltage level of the second well to be about equal to a voltage level of the first terminal. By bootstrapping the second well to a voltage level about equal to the voltage level of the first terminal, the input leakage current of the protection device can be canceled or reduced. The teachings herein can be used to reduce or eliminate leakage current of a protection device, including, for example, leakage current into a substrate or wells of the protection device from the protection device's first terminal.

The protection devices herein can be fabricated in a variety of manufacturing processes, including, but not limited to, deep submicron (DSM) complementary metal oxide semiconductor (CMOS) processes, BCD (Bipolar-CMOS-DMOS) processes, or silicon on insulator (SOT) processes.

FIG. 1 is a schematic diagram of one embodiment of an integrated circuit (IC) 10. The IC 10 includes an input node 1 (IN), a supply node 2 (V1), a protection device 3, and a precision amplifier 4.

For clarity of the figures, only certain structures of the IC 10 are shown in FIG. 1. Thus, the IC 10 can include additional, pins, pads, circuits, devices, and/or other structures.

The protection device 3 includes a first terminal electrically connected to the input node 1 and a second terminal electrically connected to the supply node 2. In certain configurations, the protection device 3 comprises a bidirectional clamp, such as a bidirectional silicon controlled rectifier (SCR) device.

In certain configurations, the input node 1 corresponds to a signal pin or pad of the IC 10 and the supply node 2 corresponds to a pin or pad of the IC 10 associated with $V_{CC}$ or ground. For example, the supply node 2 can be electrically connected to a power low supply voltage or to a ground supply voltage. In certain configurations, when the IC 10 operates with normal signaling conditions, the voltage level of the input node 1 is greater than or equal to the voltage level of the supply node 2.

The illustrated precision amplifier 4 includes a first input electrically connected to the input node 1. Thus, the precision amplifier 4 can be used to provide amplification to a signal received on the input node 1. In one example, the precision amplifier 4 includes a second input that receives a reference voltage, and the precision amplifier 4 amplifies a voltage difference between the signal received on the input node 1 and the reference voltage. In another example, the precision amplifier 4 provides amplification to a differential signal, and the signal received on the input node 1 corresponds to an inverted or non-inverted component of the differential signal. The precision amplifier 4 can correspond to a wide variety of amplification circuits, including, for example, an operational amplifier or an instrumentation amplifier.

When the IC 10 operates with normal signaling levels or conditions, the protection device 3 operates in an OFF state in which the protection device 3 should not interfere with operation of the precision amplifier 4. However, when an overstress event causes the voltage difference between the input node 1 and the supply node 2 to exceed a forward trigger voltage or a reverse trigger voltage of the protection device 3, the protection device 3 can activate to operate in an ON state to protect the precision amplifier 4 and/or other circuitry of the IC 10 from damage.

It can be desirable for the protection device 3 to have low leakage current when in the OFF state. For example, when the leakage current of the protection device 3 is relatively large, the leakage current can degrade the performance of the precision amplifier 4 by generating an input bias current.

Low input bias current is an important specification for precision amplifiers, such as for high performance instrumentation and/or operational amplifiers. For example, achieving low input bias current, such as sub-nA input bias current, has become a benchmark performance goal for commercial precision amplifier products.

However, protection devices used for overvoltage stress protection at the IC's input interface can impact the amplifier's input bias current. For example, the protection devices can introduce an additional conduction path that can contribute to the amplifier's input bias current. For example, reverse-biased blocking junctions of the protection device can generate a leakage current that can increase exponentially with temperature. For instance, a leakage current of protection device's nominally reverse-biased blocking junctions can about double for every 10° C. rise in temperature, and can become a dominant source of the amplifier's input bias current at high temperatures, such as at temperatures of 100° C. or more.

The input bias current versus temperature behavior can be present in a wide variety of instrumentation and operational amplifier products that include overstress protection circuitry, such as ESD protection devices. The protection devices can limit a minimum achievable input bias current of the amplifier. Thus, even when the amplifier is otherwise designed with small sub-nA input bias current, the leakage current of protection devices can degrade the amplifier's input bias current at high temperatures.

As described in detail herein, the protection device 3 includes a leakage current compensation circuit 5. Additionally, the protection device 3 can include an n-well and a p-well adjacent to the n-well, and the leakage current compensation circuit 5 can control the voltage level of the n-well to track or change with the voltage level of the p-well to reduce the protection device's leakage current. The leakage current compensation circuit 5 can inhibit the flow of leakage current into or out of the first terminal of the protection device 3, which in turn can enhance the performance of the precision amplifier 4. For instance, the precision amplifier 4 can operate with low input bias current even when operating at high temperatures.

Although the protection device 3 is illustrated in the context of protecting an input to a precision amplifier, the teachings herein are applicable to a wide variety of applications. For example, one or more protection devices can be used to provide protection to the pins or pads of a wide variety of ICs specified to operate with low input leakage current, including, for example, data converters, data acquisition systems, and receiver interfaces. Thus, although the IC 10 of FIG. 1 illustrates one example of an IC that can include one or more protection devices with active leakage current compensation, the teachings herein are applicable to other configurations of ICs.

Figure 2A:
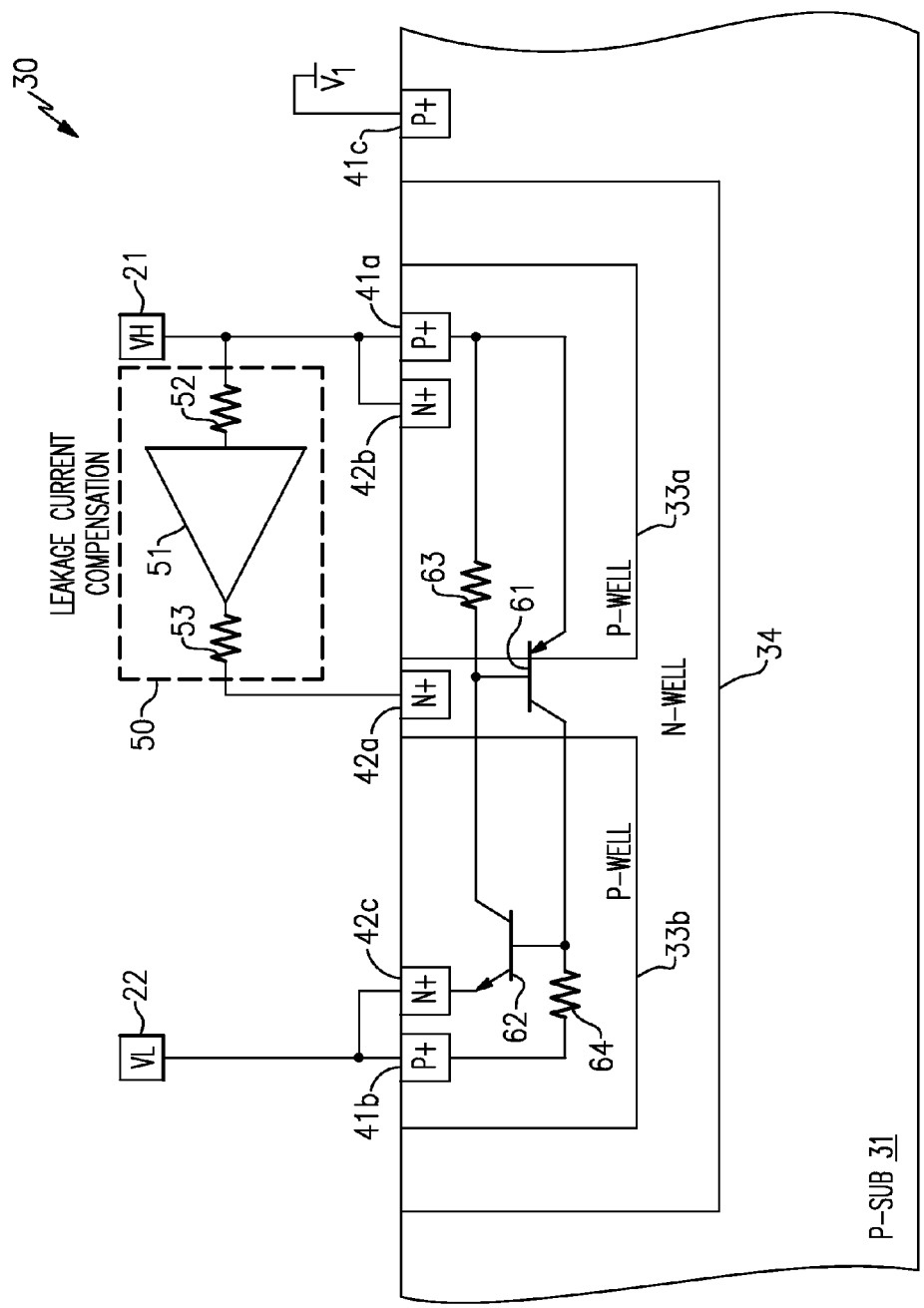
FIG. 2A is an annotated cross-section of a protection device with active leakage current compensation according to one embodiment.

FIG. 2A is an annotated cross-section of a protection device 30 with active leakage current compensation according to one embodiment.

The illustrated protection device 30 of FIG. 2A is fabricated in a p-type substrate (P-SUB) 31, and includes an n-well 34, a first p-well 33a, a second p-well 33b, a first n-type active (N+) region 42a, a second N+ region 42b, a third N+ region 42c, a first p-type active (P+) region 41a, a second P+ region 41b, a third P+ region 41c, a first terminal 21 (VH), a second terminal 22 (VL), and a leakage current compensation circuit 50.

As shown in FIG. 2A, the n-well 34 is positioned in the P-SUB 31, and the first and second p-wells 33a, 33b are positioned in the n-well 34. As shown in FIG. 2A, the first and second p-wells 33a, 33b are spaced apart from one another such that a portion of the n-well 34 is between the first and second p-wells 33a, 33b. The first N+ region 42a is in the n-well 34. Although the first N+ region 42a is illustrated as being positioned between the first and second p-wells 33a, 33b, the first N+ region 42a can be located in other positions.

The first P+ region 41a and the second N+ region 42b are positioned adjacent to one another in the first p-well 33a. Additionally, the second P+ region 41b and the third N+ region 42c are positioned adjacent to one another in the second p-well 33b. Furthermore, the third P+ region 41c is positioned in the P-SUB 31, and can be used to control the voltage level of the P-SUB 31.

The cross-section shown in FIG. 2A has been annotated to show certain structures of the protection device 30, including the leakage current compensation circuit 50, the first terminal 21, the second terminal 22, and electrical connections between active regions, terminals, and the leakage current compensation circuit 50. Although annotated in schematic form, persons having ordinary skill in the art will appreciate that the illustrated electrical connections can be made using conductors, such as metallization and vias, and that the leakage current compensation circuit 50 can be fabricated in the P-SUB 31. For example, the leakage current compensation circuit 50 can be fabricated in a portion of the P-SUB 31 that is not visible in the cross-section of FIG. 2A.

The cross-section has also been annotated to show certain transistor and resistor components associated with the illustrated semiconductor wells and active regions. For example, the protection device 30 has been annotated to include a PNP bipolar transistor 61, an NPN bipolar transistor 62, a first resistor 63, and a second resistor 64.

The NPN bipolar transistor 62 includes an emitter associated with the third N+ region 42c, a base associated with the second p-well 33b, and a collector associated with the n-well 34. Additionally, the PNP bipolar transistor 61 includes an emitter associated with the first p-well 33a, a base associated with the n-well 34, and a collector associated with the second p-well 33b. The first resistor 63 is associated with a well resistance of the first p-well 33a between the base of the PNP bipolar transistor 61 and the first P+ region 41a. Additionally, the second resistor 64 is associated with a well resistance of the second p-well 33b between the base of the NPN bipolar transistor 62 and the second P+ region 41b.

The NPN bipolar transistor 62 and the PNP bipolar transistor 61 are cross-coupled, with the base of the NPN bipolar transistor 62 electrically connected to the collector of the PNP bipolar transistor 61 and with the collector of the NPN bipolar transistor 62 electrically connected to the base of the PNP bipolar transistor 61. The NPN bipolar transistor 62 and the PNP bipolar transistor 61 operate as a silicon controlled rectifier (SCR) device.

In the illustrated configuration, the first P+ region 41a and the second N+ region 42b are electrically connected to the first terminal 21, and the second P+ region 41b and the third N+ region 42c are electrically connected to the second terminal 22. Additionally, the third P+ region 41c is electrically connected to a first voltage $V_1$, which be, for example, a power low or ground supply. In certain configurations, the second terminal 22 is also electrically connected to the first voltage $V_1$.

The leakage current compensation circuit 50 includes an input electrically connected to the first terminal 21 and an output electrically connected to the first N+ region 42a. The leakage current compensation circuit 50 controls a voltage level of the n-well 34 based on the voltage level of the first terminal 21, thereby reducing a voltage difference between the n-well 34 and the first p-well 33a to inhibit leakage current flowing into or out of the first terminal 21.

In the illustrated configuration, the leakage current compensation circuit 50 includes a buffer 51, an input resistor 52, and an output resistor 53. The input resistor 52 is electrically connected between the first terminal 21 and an input to the buffer 51, and the output resistor 53 is electrically connected between an output of the buffer 51 and the first N+ region 42a.

In certain configurations, a voltage gain from the input to the output of the buffer 51 can be between 0.5 and 1.5, for example, 1. Thus, the buffer 51 can be used to control the voltage level of the n-well 34 via the first N+ region 42a to be about equal to the voltage level of the first terminal 21. Since the first p-well 33a is electrically connected to the first terminal 21 via the first P+ region 41a, the buffer 51 also controls the voltage of the level of the n-well 34 to be about equal to the voltage level of the first p-well 33a. Controlling the voltage level of the n-well 34 in this manner can reduce the leakage current flowing into or out of the protection device's first terminal by reducing a leakage current of the base-to-emitter junction of the PNP bipolar transistor 61.

In one embodiment, the leakage current compensation circuit 50 is configured to control the voltage level of the n-well 34 such that the magnitude of the voltage difference between the first p-well 33a and the n-well 34 is less than 700 mV. Using the leakage current compensation circuit 50 to control the voltage difference between the n-well 34 and the first p-well 33a to a relatively small level can reduce the leakage current of the first terminal of the protection device 30.

The input resistor 52 can aid in protecting the buffer 51 from damage during an overstress event, such as an ESD event, that causes the voltage difference between the first and second terminals 21, 22 to change. For example, the input resistor 52 can help prevent charge from flowing into or out of the buffer's input during an ESD event. In one embodiment, the input resistor 52 has a resistance selected to be in the range of 10 kΩ and 100 MΩ. Although one example of resistance values for the input resistor 52 has been provided, the input resistor 52 can have other resistance values, such as resistance values associated with a particular application and/or manufacturing process.

The output resistor 53 provides impedance between the output of the buffer 51 and the n-well 34 to prevent the buffer 51 from impacting the operation of the protection device 30 during overstress events. For example, when the illustrated SCR device activates in response to an overstress event, the output resistor 53 limits a flow of current into or out of the n-well 34 from the buffer's output to prevent the buffer 51 from interfering with the SCR device's operation. The output resistor 53 also provides secondary overstress protection to the output of the buffer 51.

In one embodiment, the output resistor 53 has a resistance selected to be in the range of 10 kΩ and 100 MΩ. Although one example of a resistance range has been provided, the output resistor 53 can have other resistance values, such as resistance values associated with a particular application and/or manufacturing process.

Although the illustrated embodiment includes both the input resistor 52 and the output resistor 53, the teachings herein are also applicable to configurations that omit the input resistor 52 and/or the output resistor 53.

The first terminal 21 can be electrically connected to an input node of an IC, such as a signal pin or pad. Additionally, the leakage current compensation circuit 50 can reduce or eliminate the leakage current of the first terminal of the protection device 30, even when the protection device 30 operates at high temperatures. In contrast, when the leakage current compensation circuit 50 is omitted, the protection device's leakage current can dramatically increase at high temperature. For example, when normal signaling conditions are present and the protection device operates at room temperature, the leakage current of the junction between the n-well 34 and the first p-well 33a can be relatively small, typically in the pA range. However, at relatively high temperatures (for example, temperatures greater than 100° C.), the leakage current of the junction can exponentially increase and reach a nA-level when the leakage current compensation circuit 50 is not present. The leakage current can become the dominant source of the bias current of a precision amplifier that is coupled to the first terminal 21.

In one embodiment, the leakage current of the first terminal 21 of the protection device 30 is given by Equation 1 below, where β is the current gain of the PNP bipolar transistor 61, $I_S$ is the saturation current of the PNP bipolar transistor 61, $V_{BE}$ is the base-to-emitter voltage of the PNP bipolar transistor 61, and $V_T$ is the thermal voltage. As persons having ordinary skill in the art will appreciate, the thermal voltage $V_T$ can be equal to kT/q, where k is Boltzmann's constant, T is temperature, and q is the magnitude of an electron's charge.

$$(1 + 1/\beta) \cdot I_S \cdot \left(\exp\left(\frac{V_{BE}}{V_T}\right) - 1\right) \quad \text{Equation 1}$$

By bootstrapping the n-well 34 to a voltage level that is about equal to the voltage level of the first terminal 21, the voltage difference between the n-well 34 and the first p-well 33a can be relatively small such that the base-emitter junction of the PNP bipolar transistor 61 has a near-zero base-to-emitter voltage $V_{BE}$ and conducts a negligible current.

Accordingly, the leakage current compensation circuit 50 can provide leakage current compensation to the protection device 30. When the leakage current compensation circuit 50 controls the PNP bipolar transistor 61 in this manner, the PNP bipolar transistor 61 operates with low leakage performance similar to that of BVCES operation (emitter-to-collector breakdown voltage with the base short circuited to emitter), rather than with performance similar to that of BVCEO operation (emitter-to-collector breakdown voltage with open base).

Thus, the leakage current of the junction between the n-well 34 and the first p-well 34a can be reduced or eliminated, which in turn inhibits leakage current flowing into or out of the first terminal 21. Additionally, leakage currents of other structures, such as junctions of the NPN bipolar transistor 62, can be supplied from the output of the buffer 51. Although an overall static power dissipation of the protection device 30 may not be reduced, a leakage current of the first terminal 21 can be reduced or eliminated. Thus, sensitive electronics, such as precision amplifiers, may be electrically connected to the first terminal 21 and operate without performance degradation due to leakage current into or out of the first terminal 21 of the protection device 30. In certain configurations, the protection device 20 protects an input to a precision amplifier, and the leakage current compensation circuit 50 can be used to achieve sub-nA input bias currents of the precision amplifier even at high temperatures.

When the protection device 30 operates in the OFF state, the bias voltage across the base-emitter junction of the PNP bipolar transistor 61 can be based on an input offset voltage of the buffer 51. For example, in certain configurations, the voltage difference between the n-well 34 and the first p-well 33a can be about equal to the buffer's input offset voltage. In certain implementations, a typical input offset voltage of the buffer 51 should be less than the thermal voltage $V_T$. For example, the input offset voltage ($V_{OS}$) may be a few mV, and thus the compensated leakage current of the protection device would be smaller than a factor of $V_{OS}/V_T$ than a similar protection that operates without leakage compensation.

To provide a further reduction in leakage current, the input offset voltage of the buffer 51 can be trimmed, chopped, and/or auto-zeroed. Reducing the buffer's input offset voltage can reduce the protection device's leakage current by reducing a voltage difference between the n-well 34 and the first p-well 33a, thereby reducing a leakage current associated with base-emitter junction of the PNP bipolar transistor 61.

Figure 2B:
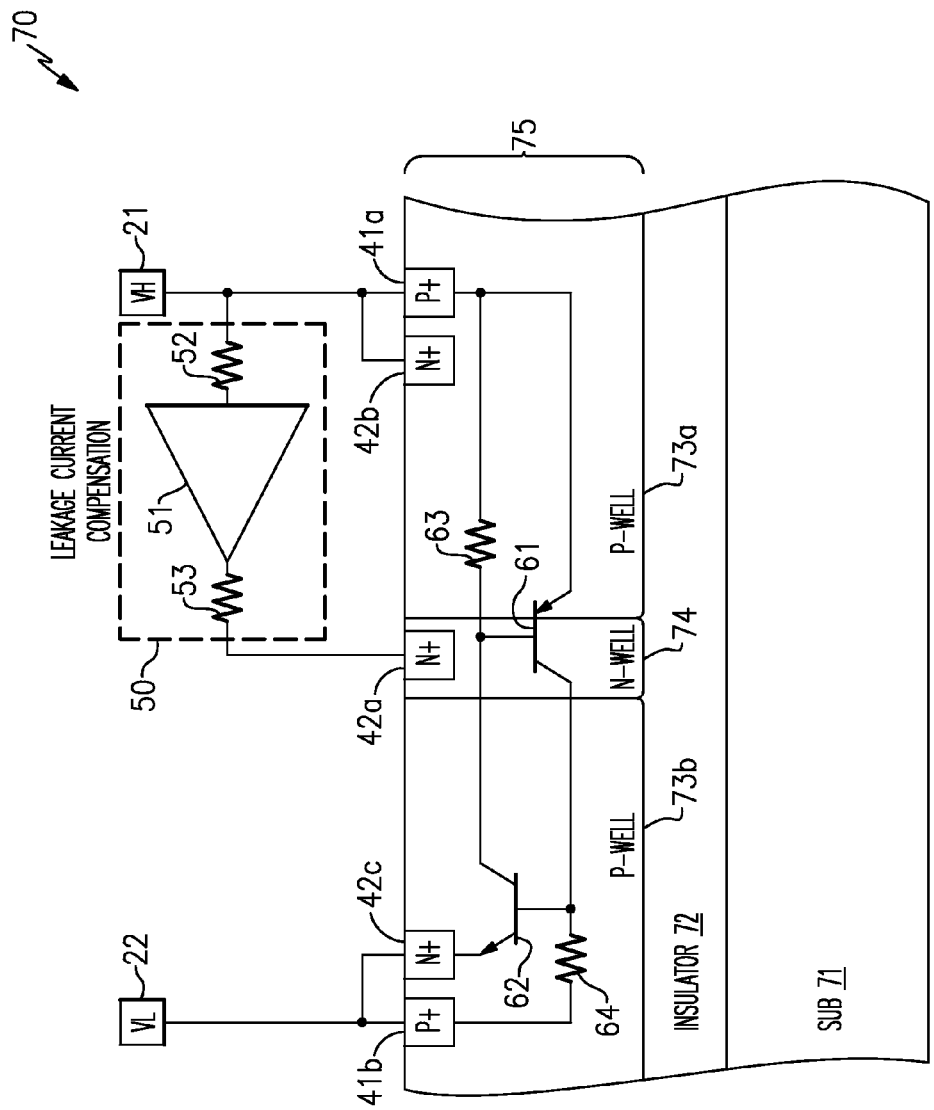
FIG. 2B is an annotated cross-section of a protection device with active leakage current compensation according to another embodiment.

FIG. 2B is an annotated cross-section of a protection device 70 with active leakage current compensation according to another embodiment. The protection device 70 of FIG. 2B is similar to the protection device 30 of FIG. 2A, except that the protection device 70 has been fabricated using an SOI process.

For example, the protection device 70 of FIG. 2B is fabricated in a semiconductor layer 75. As shown in FIG. 2B, the semiconductor layer 75 is positioned over an insulator layer 72, which in turn is positioned over a support substrate 71. As skilled artisans will appreciate, the support substrate 71 can correspond to a doped or undoped substrate. Additionally, the insulator layer 72 can be implemented in a variety of ways, such as by using a buried oxide (BOX) layer.

The protection device 70 includes an n-well 74, a first p-well 73a, a second p-well 73b, first to third N+ regions 42a-42c, first and second P+ regions 41a, 41b, first and second terminals 21, 22, and the leakage current compensation circuit 50. The n-well 74 is positioned between the first and second p-wells 73a, 73b in the semiconductor layer 75. The first N+ region 42a is in the n-well 74. Additionally, the first P+ region 41a and the second N+ region 42b are in the first p-well 73a, and are electrically connected to the first terminal 21. Furthermore, the second P+ region 41b and the third N+ region 42c are in the second p-well 73b, and are electrically connected to the second terminal 22. The leakage current compensation circuit 50 includes an input electrically connected to the first terminal and an output electrically connected to the first N+ region 42a.

Additional details of the protection device 70 can be similar to those described earlier.

Figure 3A:
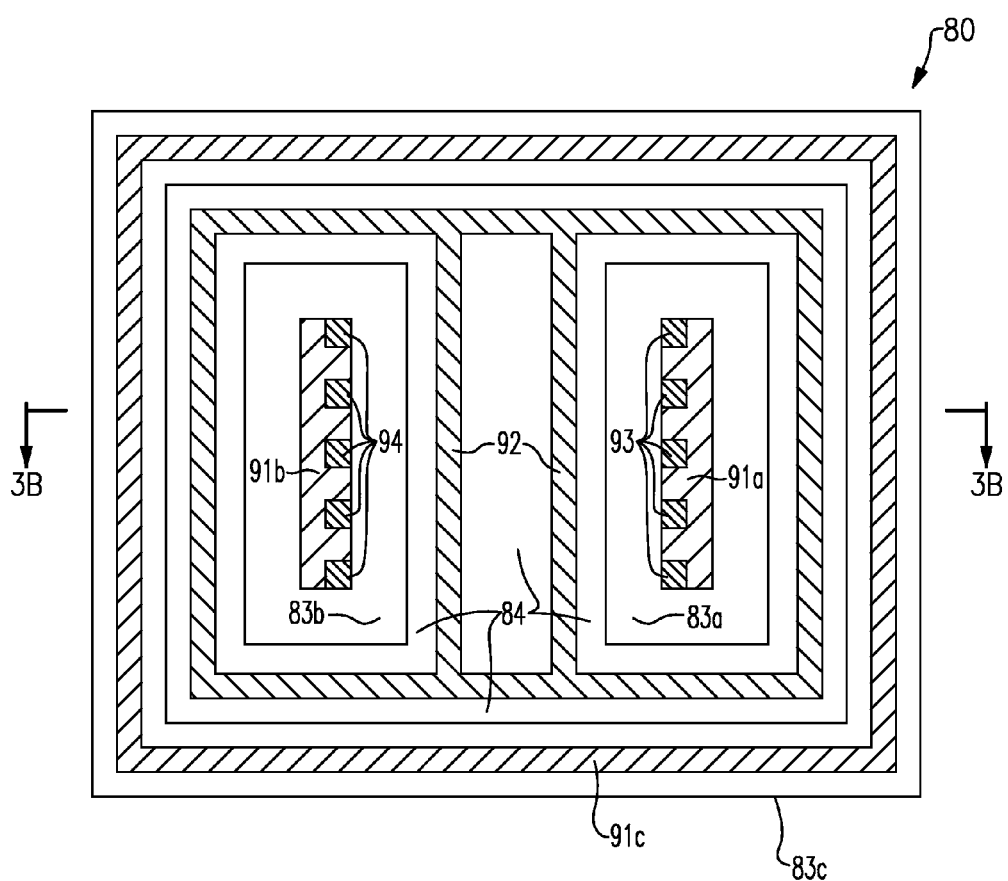
FIG. 3A is a top plan view of a protection device with active leakage current compensation according to another embodiment.
Figure 3B:
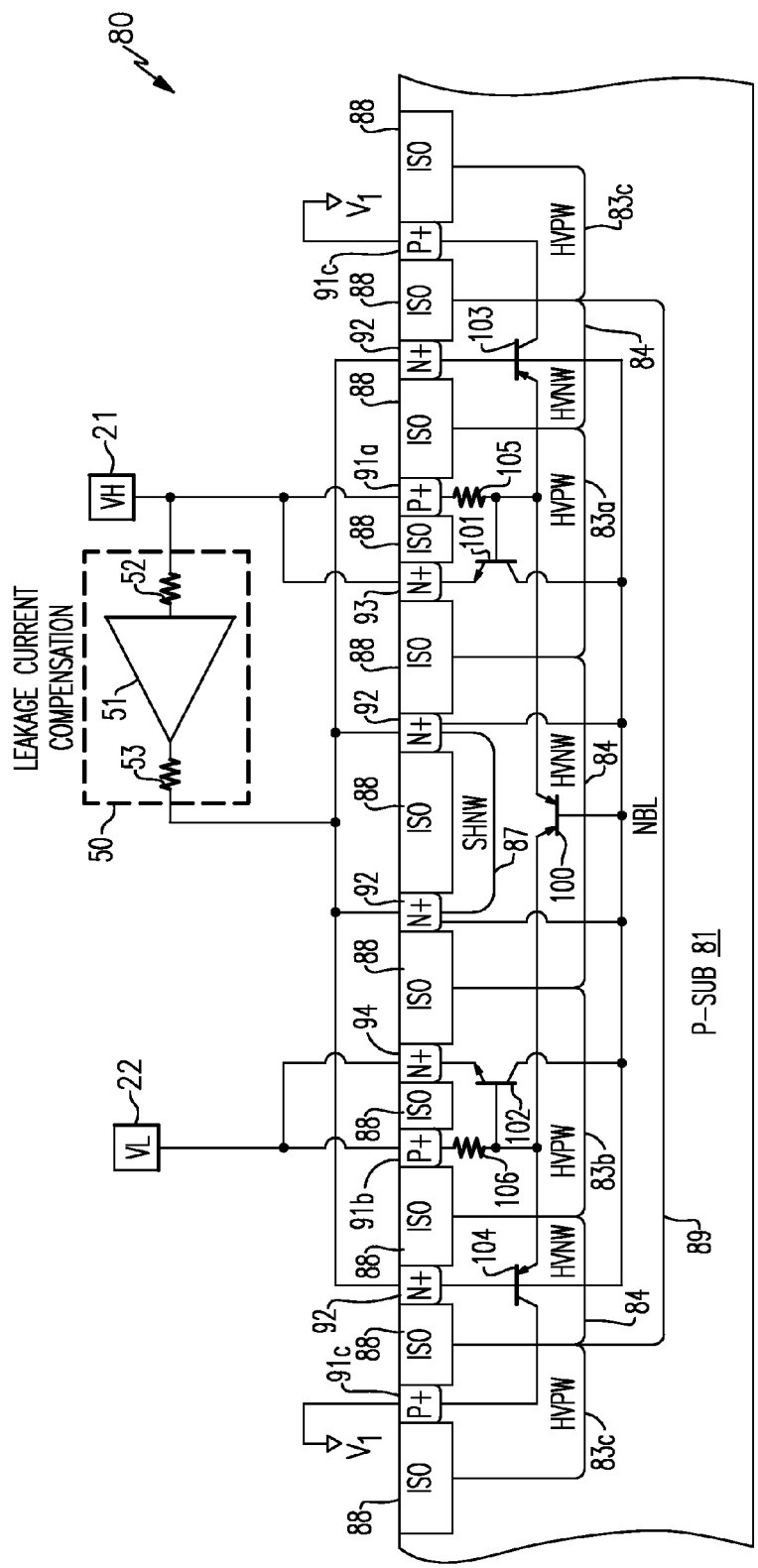
FIG. 3B is an annotated cross-section of the protection device of FIG. 3A taken along the lines 3B-3B of FIG. 3A.

FIG. 3A is a top plan view of a protection device 80 with active leakage current compensation according to another embodiment. FIG. 3B is an annotated cross-section of the protection device 80 of FIG. 3A taken along the lines 3B-3B of FIG. 3A.

The illustrated protection device 80 of FIGS. 3A-3B is fabricated in a p-type substrate (P-SUB) 81, and includes a high voltage n-type well (HVNW) 84, a first high voltage p-type well (HVPW) 83a, a second HVPW 83b, a third HVPW 83c, a first P+ region 91a, a second P+ region 91b, an N+ region 92, a first array of N+ regions 93, a second array of N+ regions 94, a shallow n-type well (SHNW) 87, an n-type buried layer (NBL) 89, and isolation regions 88.

For purposes of clarity of the figures, only the HVNW 84, the HVPWs 83a-83c, the P+ regions 91a-91c, and the N+ regions 92-94 are shown in the top plan view of FIG. 3A.

As shown in FIG. 3A, the first HVPW 83a is implemented as a first island in the HVNW 84. Additionally, the second HVPW 83b is implemented as a second island in the HVNW 84, and is spaced apart from the first HVPW 83a. A central portion of the HVNW 84 is positioned between the first HVPW 83a and the second HVPW 83b, and operates as a current path when the protection device 80 is activated. The third HVPW 83c surrounds a perimeter of the HVNW 84.

The first P+ region 91a is positioned in the first HVPW 83a, and is implemented to have a comb shape in this embodiment. Additionally, the first array of N+ regions 93 is positioned in the first HVPW 83a adjacent to the first P+ region 91a, such that portions of the first P+ region 91a extend between adjacent pairs of N+ regions in the first array. The second P+ region 91b is positioned in the second HVPW 83b, and is implemented to have a comb shape in this embodiment. Additionally, the second array of N+ regions 93 is positioned in the second HVPW 83b, such that portions of the second P+ region 91b extend between adjacent pairs of N+ regions in the second array. The first and second P+ regions 91a, 91b are orientated such that the extending portions of the first P+ region 91a face the extending portions of the second P+ region 91b.

Configuring the protection device 80 in this manner can be used to increase the forward holding and trigger voltage of the protection device 80. Although one example of active regions in the first and second HVPWs 83a, 83b has been shown, other configurations are possible. For example, in another embodiment, the first HVPW 83a includes a first P+ region and a first N+ region that extend in a first or the vertical direction alongside one another, and the second HVPW 83*b* includes a second P+ region and a second N+ region that extend in the vertical direction alongside one another.

The third HVPW 83*c* is implemented as a ring that surrounds and abuts the HVNW 84. Additionally, the third P+ region 91*c* is positioned in the third HVPW 83*c*, and operates with the third HVPW 83*c* as a guard ring of the protection device 80. The guard ring can inhibit or eliminate formation of unintended parasitic paths between the protection device 80 and surrounding semiconductor components when integrated on-chip. In the illustrated configuration, the guard ring is electrically connected to a first voltage $V_1$ which can be, for example, a ground or power low supply voltage. Although FIGS. 3A-3B illustrate the third HVPW 83*c* as abutting the HVNW 84, in other configurations the third HVPW 83*c* is spaced apart from the HVNW 84 to enhance latch-up immunity at an expense of an increase in area.

In the illustrated embodiment, the SHNW 87 is positioned in the central portion of the HVNW 84 between the first and second HVPWs 83*a*, 83*b*. Additionally, the NBL layer 89 is positioned beneath the HVNW 84, the first HVPW 83*a*, and the second HVPW 83*b*. The NBL layer 89 electrically isolates the first HVPW 83*a* and the second HVPW 83*b* from the P-SUB 81, thereby permitting the first and second HVPWs 83*a*, 83*b* to operate at different electrical potentials from the P-SUB 81. As used herein, and as will be understood by one of skill in the art, the term "n-type buried layer" refers to any suitable n-type isolation layer or structure, including, for example, those used in buried n-layer technologies or in deep n-well technologies.

As shown in FIG. 3B, the N+ region 92 is positioned in the HVNW 84, and is electrically connected to the output of the leakage current compensation circuit 50 via metallization. The leakage current compensation circuit 50 controls the voltage level of the HVNW 84 and the NBL layer 89 to track or change with the voltage level of the first terminal 21. Configuring the protection device 80 in this manner can provide active compensation that reduces or eliminates the flow of leakage current into or out of the first terminal 21, which can prevent the protection device 80 from interfering with the operation of other circuitry that is also electrically connected to the first terminal 21.

Although FIG. 3B illustrates an embodiment in which the protection device 80 is fabricated directly in the P-SUB 81, other configurations are possible. For example, in another embodiment, the protection device 80 is fabricated using an SOI process, and the NBL layer 89 is omitted in favor of isolating the HVNW 84 and the HVPWs 81*a*-81*c* from a support substrate using an insulator layer. In yet another embodiment, the protection device 80 is fabricated in a p-type epitaxial (P-EPI) layer. For example, the P-EPI layer can be disposed over a doped or undoped support substrate, and the protection device 80 can be fabricated in the P-EPI layer. In certain configurations, the support substrate is implanted with the NBL layer 89, and the P-EPI layer is grown over the carrier substrate and NBL layer 89 using an epitaxial growth process. Additionally, the HVNW 84, the HVPWs 83*a*-83*c*, and the SHNW 87 can be implanted in the P-EPI layer. Furthermore, the isolation regions 88 can be formed over the surface of the P-EPI layer, and N+ regions and P+ regions can be implanted in the corresponding well regions.

Although not illustrated in FIGS. 3A-3B for clarity of the figures, the P-SUB 81 can also include other devices or structures formed therein.

In the illustrated configuration, the first HVPW 83*a* and the second HVPW 83*b* extend or are elongated in a first or vertical direction. Additionally, a current flow of the protection device 80 when activated is in a second or horizontal direction.

The N+ region 92 includes a first ring structure that surrounds a perimeter of the first HVPW 83*a* and a second ring structure that surrounds a perimeter of the second HVPW 83*b*. Configuring the N+ region 92 in this manner can provide robust control over the voltage level of the HVNW 84, which can help the leakage current compensation circuit 50 in controlling the voltage level of the HVNW 84 relative to the voltage level of the first terminal 21.

The illustrated blocking voltage device 80 includes the isolation regions 88. Formation of the isolation regions 88 can involve etching trenches in the P-SUB 81, filling the trenches with a dielectric, such as silicon dioxide ($SiO_2$), and removing the excess dielectric using any suitable method, such as chemical-mechanical planarization.

The cross-section shown in FIG. 3B has been annotated to show certain structures of the protection device 80, including the leakage current compensation circuit 50, the first terminal 21, the second terminal 22, and electrical connections between active regions, terminals, and the leakage current compensation circuit 50. Although annotated in schematic form, persons having ordinary skill in the art will appreciate that the illustrated electrical connections can be made using metallization and vias, and that the leakage current compensation circuit 50 can be fabricated in the P-SUB 81. For example, the leakage current compensation circuit 50 can be fabricated in a portion of the P-SUB 81 that is not visible in the cross-section of FIG. 3B.

The cross-section has also been annotated to show certain transistor and resistor components associated with the illustrated semiconductor wells and active regions. For example, the protection device 80 has been annotated to include a bidirectional PNP bipolar transistor 100, a first NPN bipolar transistor 101, a second NPN bipolar transistor 102, a first PNP bipolar transistor 103, a second PNP bipolar transistor 104, a first resistor 105, and a second resistor 106.

The bidirectional PNP bipolar transistor 100 includes an emitter/collector associated with the first HVPW 83*a*, a base associated with the HVNW 84, and a collector/emitter associated with the second HVPW 83*b*. The first NPN bipolar transistor 101 includes an emitter associated with the first array of N+ regions 93, a base associated with the first HVPW 83*a*, and a collector associated with the HVNW 84. The second NPN bipolar transistor 103 includes an emitter associated with the second array of N+ regions 94, a base associated with the second HVPW 83*b*, and a collector associated with the HVNW 84. The first PNP bipolar transistor 103 includes an emitter associated with the first HVPW 83*a*, a base associated with the HVNW 84, and a collector associated with the third HVPW 83*c*. The second PNP bipolar transistor 104 includes an emitter associated with the second HVPW 83*b*, a base associated with the HVNW 84, and a collector associated with the third HVPW 83*c*. The first resistor 105 is associated with a well resistance of the first HVPW 83*a*, and the second resistor 106 is associated with a well resistance of the second HVPW 83*b*.

The bidirectional PNP bipolar transistor 100 operates bidirectionally, and the operation of the emitter/collector and the collector/emitter as emitter and collector can depend on the voltage conditions of the first and second terminals 21, 22. For example, when an overstress event causes the voltage level of the first terminal 21 to be greater than a voltage level of the second terminal 22, the emitter/collector of the bidirectional PNP bipolar transistor 100 serves as an emitter and the collector/emitter of the bidirectional PNP bipolar transistor 100 serves as a collector. In contrast, when an overstress event causes the voltage level of the first terminal 21 to be less than the voltage level of the second terminal 22, the emitter/collector of the bidirectional PNP bipolar transistor 100 serves as a collector and the collector/emitter of the bidirectional PNP bipolar transistor 100 serves as an emitter.

When a positive polarity overstress event causes the voltage level of the first terminal 21 to be greater than the voltage level of the second terminal 22, the bidirectional PNP bipolar transistor 100 can operate with the second NPN bipolar transistor 102 as a first SCR device that provides forward overstress protection. Additionally, when a negative polarity overstress event causes the voltage level of the first terminal 21 to be less than the voltage level of the second terminal 22, the bidirectional PNP bipolar transistor 100 can operate with the first NPN bipolar transistor 101 as a second SCR device that provides reverse overstress protection. In this manner, the protection device 80 provides bidirectional protection.

However, during normal operating conditions or signaling levels, the protection device 80 should be turned off and not conduct.

As shown in FIG. 3B, the leakage current compensation circuit 50 controls a voltage difference between the HVNW 84 and the first HVPW 83*a*, and thus also controls a voltage difference between the emitter/collector and the base of the PNP bidirectional bipolar transistor 100. Thus, in the illustrated in embodiment, the leakage current compensation circuit 50 turns off the junction between the emitter/collector and the base of the PNP bidirectional bipolar transistor 100 to inhibit a leakage current of the first terminal of the protection device.

The protection device 80 of FIGS. 3A-3B corresponds to another embodiment of the protection device 3 shown in FIG. 1. For example, the first terminal 21 can be electrically connected to input node 1, and the second terminal 22 can be electrically connected to the supply node 2. However, the protection device 80 can be used in other configurations of integrated circuits.

In FIGS. 3A-3B, the protection device 80 is symmetrical about a center of the HVNW 84. However, persons having ordinary skill in the art will appreciate that the teachings herein are also applicable to asymmetric devices. For example, asymmetrical structures can be provided by arranging the wells, active regions, and/or other structures of the device in an asymmetric configuration.

Additional details of the protection device 80 can be similar to those described earlier.

Figure 4:
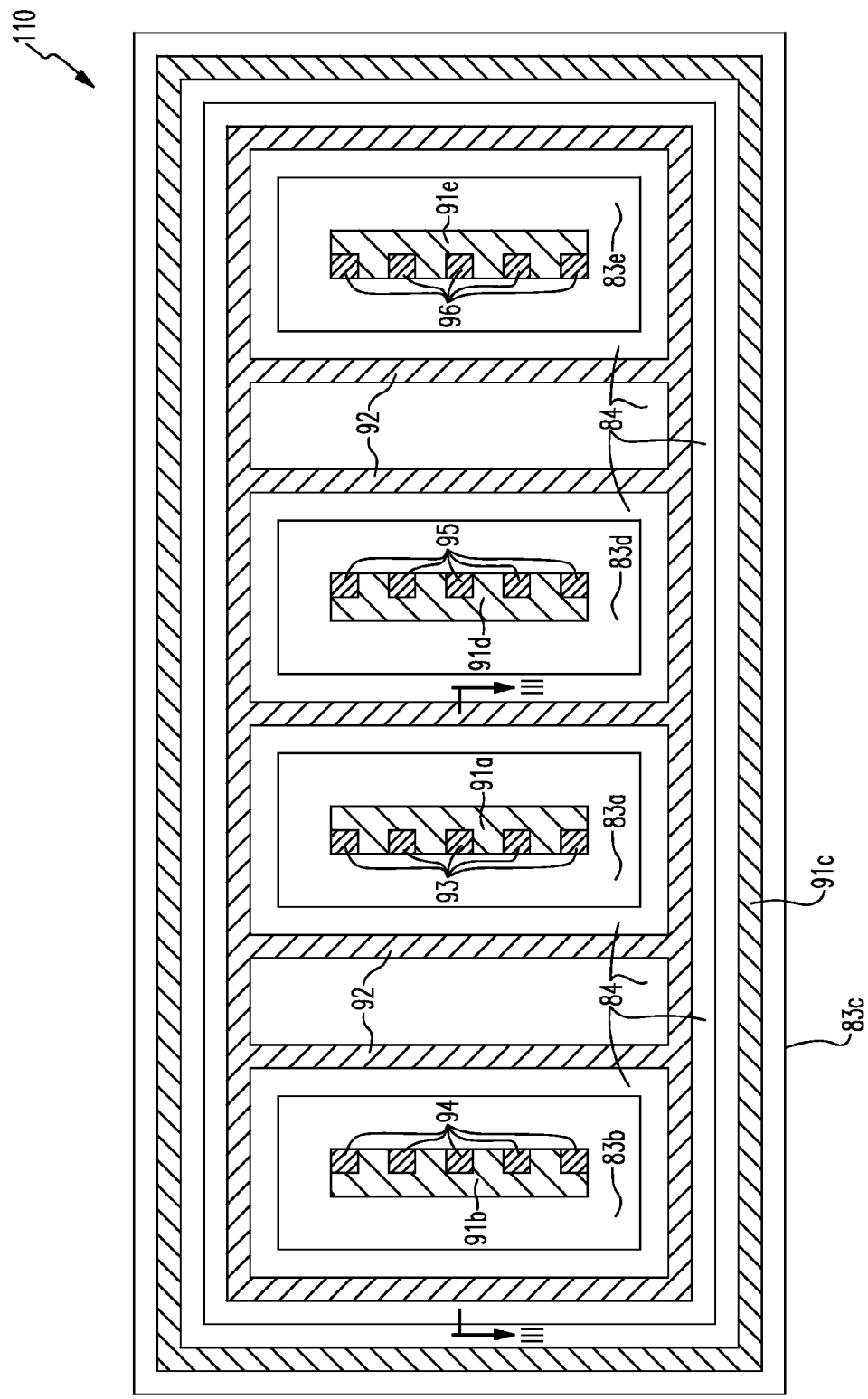
FIG. 4 is a top plan view of a protection device with active leakage current compensation according to another embodiment.

FIG. 4 is a top plan view of a protection device 110 with active leakage current compensation according to another embodiment. The protection device 110 of FIG. 4 is similar to the protection device 80 of FIGS. 3A-3B, except that the protection device 110 of FIG. 4 further includes a fourth HVPW 83*d*, a fifth HVPW 83*e*, a fourth P+ region 91*d*, a fifth P+ region 91*e*, a third array of N+ regions 95, and a fourth array of N+ regions 96.

The protection device 110 of FIG. 4 has a cross-section along the lines 111-111 that is similar to the cross-section of the protection device 80 shown in FIG. 3B.

Although not illustrated in FIG. 4, the first P+ region 91*a*, the first array of N+ regions 93, the fourth P+ region 91*d*, and the third array of N+ regions 95 can be electrically connected to a first terminal of the protection device 110 (for example, the first terminal 21 of FIG. 3B). Additionally, the second P+ region 91*b*, the second array of N+ regions 94, the fifth P+ region 91*e*, and the fourth array of N+ regions 96 can be electrically connected to a second terminal of the protection device 110 (for example, the second terminal 22 of FIG. 3B). Additionally, the protection device 110 includes a leakage current compensation circuit (for example, the leakage current compensation circuit 50 of FIG. 3B), which controls a voltage level of the N+ region 92 based on the voltage level of the first terminal. Thus, the voltage level of the HVNW 84 tracks or changes with the voltage levels of the first and fourth HVPWs 83*a*, 83*d*.

When the first terminal is electrical connected to an input node of an IC's interface such as an input signal pin, the input node is coupled to a center of the protection device 110, which can enhance isolation. Additionally, the second terminal of the protection device can be electrically connected via metallization to a supply node such as a ground pin, which can provide uniform and fast activation by radial current conduction from the center of the device to the periphery. The illustrated configuration can also facilitate implementation of active leakage current compensation, since the N+ region 92 is distributed throughout the protection device 110.

Although the illustrated configuration includes two sections of SCR devices, the teachings herein are applicable to configurations in which a protection device includes more of fewer sections of SCR devices. For example, additional sections of SCR devices can be added and electrically connected using metallization to provide higher current handling capability. Additionally, the teachings herein are applicable to configurations with one section of SCR devices (for example, the protection device 80 of FIG. 3A).

Additional details of the protection device 110 can be similar to those described earlier.

Figure 5A:
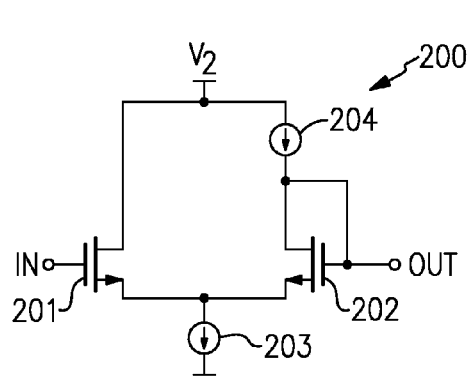
FIG. 5A is a circuit diagram of a buffer according to one embodiment.

FIG. 5A is a circuit diagram of a buffer 200 according to one embodiment. The buffer 200 includes a first n-type metal oxide semiconductor (NMOS) transistor 201, a second NMOS transistor 202, a first current source 203, and a second current source 204. The buffer 200 further includes an input IN and an output OUT.

As shown in FIG. 5A, a gate of the first NMOS transistor 201 is electrically connected to the input IN, and a drain of the first NMOS transistor 201 is electrically connected to a second voltage $V_2$, which can be, for example, a power high supply voltage. The first current source 203 includes a first terminal electrically connected to the sources of the first and second NMOS transistors 201, 202, and a second terminal electrically connected to a first voltage $V_1$, which can be, for example, a ground or power low supply voltage. The second current source 204 includes a first terminal electrically connected to the second voltage $V_2$ and a second terminal electrically connected to the output OUT and to a drain and a gate of the second NMOS transistor 202.

The buffer 200 can operate to control the voltage level of the output OUT based on a voltage level of the input IN. For example, the voltage level of the sources of the first and second NMOS transistors 51, 52 can track or change with the voltage level of the input IN. For instance, in the steady-state, the gate-to-source voltage ($V_{GS}$) of the first and second NMOS transistors 201, 202 can be about equal to one another, and the voltage level of the output OUT can be about equal to the input IN.

The buffer 200 of FIG. 5A illustrates one example implementation of the buffer 51 shown in FIGS. 2A, 2B, and 3B. However, the buffer 51 of FIGS. 2A, 2B, and 3B can be implemented in a wide variety of ways.

Figure 5B:
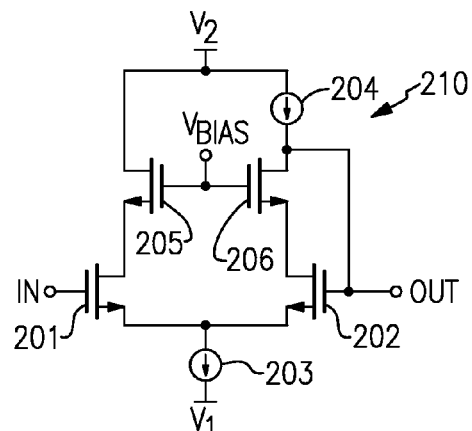
FIG. 5B is a circuit diagram of a buffer according to another embodiment.

FIG. 5B is a circuit diagram of a buffer 210 according to another embodiment. The buffer 210 of FIG. 5B is similar to the buffer 200 of FIG. 5A, except that the buffer 210 further includes a third NMOS transistor 205 and a fourth NMOS transistor 206.

As shown in FIG. 5B, the third NMOS transistor 205 is arranged in a cascode with the first NMOS transistor 201. For example, the third NMOS transistor 205 includes a source electrically connected to the drain of the first NMOS transistor 201, a gate electrically connected to a bias voltage $V_{BIAS}$, and a drain electrically connected to the second voltage $V_2$. Additionally, the fourth NMOS transistor 206 is arranged in a cascode with the second NMOS transistor 202. In particular, the fourth NMOS transistor 206 includes a source electrically connected to the drain of the second NMOS transistor 202, a gate electrically connected to the bias voltage $V_{BIAS}$, and a drain electrically connected to second terminal of the second current source 204.

Including the third and fourth NMOS transistors 205, 206 can enhance performance of the buffer circuit 210 of FIG. 5B relative to the buffer circuit 200 of FIG. 5A by enhancing gate-to-source voltage ($V_{GS}$) matching of the first and second NMOS transistors 201, 202 during operation. For example, including the third and fourth NMOS transistors 205, 206 can limit the impact of channel length modulation or other transistor non-idealities from impacting the accuracy of the buffering.

The buffer 210 of FIG. 5B illustrates another example implementation of the buffer 51 shown in FIGS. 2A, 2B, and 3B. However, the buffer 51 of FIGS. 2A, 2B, and 3B can be implemented in a wide variety of ways.

Figure 5C:
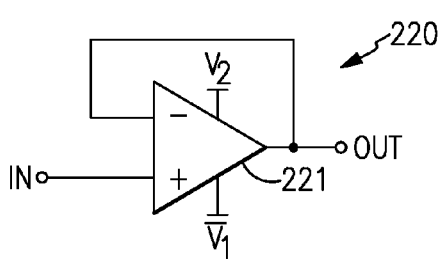
FIG. 5C is a circuit diagram of a buffer according to another embodiment.

FIG. 5C is a circuit diagram of a buffer 220 according to another embodiment. The buffer 220 includes an amplifier 221 including an inverting input, a non-inverting input, and an output. The buffer 200 further includes an input IN and an output OUT.

As shown in FIG. 5C, the input IN is electrically connected to the non-inverting input of the amplifier 221, and the output OUT is electrically connected to the output of the amplifier 221. Additionally, the amplifier's output is electrically connected to the amplifier's inverting input, and thus the amplifier 221 operates with negative feedback. Although not shown in FIG. 5C, the amplifier 221 can include feedback circuitry such as resistors and/or capacitors in the feedback path from the amplifier's output to inverting input to provide desired feedback and/or to maintain stability.

The buffer 220 of FIG. 5C illustrates another example implementation of the buffer 51 shown in FIGS. 2A, 2B, and 3B. However, the buffer 51 of FIGS. 2A, 2B, and 3B can be implemented in a wide variety of ways.

Figure 5D:
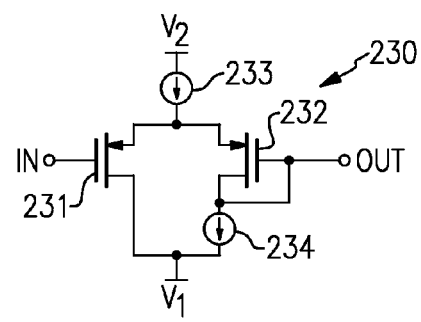
FIG. 5D is a circuit diagram of a buffer according to another embodiment.

FIG. 5D is a circuit diagram of a buffer 230 according to another embodiment. The buffer 230 includes a first p-type metal oxide semiconductor (PMOS) transistor 231, a second PMOS transistor 232, a first current source 233, and a second current source 234. The buffer 230 further includes an input IN and an output OUT.

The buffer 230 of FIG. 5D is similar to the buffer 200 of FIG. 5A, except that the buffer 230 illustrates a configuration implemented using PMOS transistors rather than NMOS transistors. Persons having ordinary skill in the art will appreciate that the buffers herein can be implemented using a wide variety of types of transistors, including, for example, NMOS transistors, PMOS transistors, NPN bipolar transistors, PNP bipolar transistors, or a combination thereof.

As shown in FIG. 5D, a gate of the first PMOS transistor 231 is electrically connected to the input IN, and a drain of the first PMOS transistor 231 is electrically connected to the first voltage $V_1$. The first current source 233 includes a first terminal electrically connected to the sources of the first and second PMOS transistors 231, 232, and a second terminal electrically connected to the second voltage $V_2$. The second current source 234 includes a first terminal electrically connected to the first voltage $V_1$ and a second terminal electrically connected to the output OUT and to a drain and a gate of the second PMOS transistor 232.

The buffer 230 of FIG. 5D illustrates another example implementation of the buffer 51 shown in FIGS. 2A, 2B, and 3B. However, the buffer 51 of FIGS. 2A, 2B, and 3B can be implemented in a wide variety of ways.

Figure 5E:
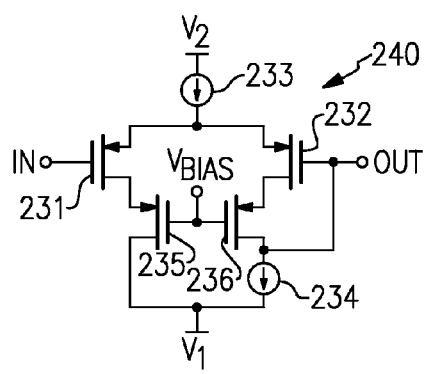
FIG. 5E is a circuit diagram of a buffer according to another embodiment.

FIG. 5E is a circuit diagram of a buffer 240 according to another embodiment. The buffer 240 of FIG. 5E is similar to the buffer 230 of FIG. 5D, except that the buffer 240 further includes a third PMOS transistor 235 and a fourth PMOS transistor 236.

As shown in FIG. 5E, the third PMOS transistor 235 is arranged in a cascode with the first PMOS transistor 231. For example, the third PMOS transistor 235 includes a source electrically connected to the drain of the first PMOS transistor 231, a gate electrically connected to a bias voltage $V_{BIAS}$, and a drain electrically connected to the first voltage $V_1$. Additionally, the fourth PMOS transistor 236 is arranged in a cascode with the second PMOS transistor 232. In particular, the fourth PMOS transistor 236 includes a source electrically connected to the drain of the second PMOS transistor 232, a gate electrically connected to the bias voltage $V_{BIAS}$, and a drain electrically connected to second terminal of the second current source 234.

The buffer 240 of FIG. 5E illustrates another example implementation of the buffer 51 shown in FIGS. 2A, 2B, and 3B. However, the buffer 51 of FIGS. 2A, 2B, and 3B can be implemented in a wide variety of ways.

Figure 5F:
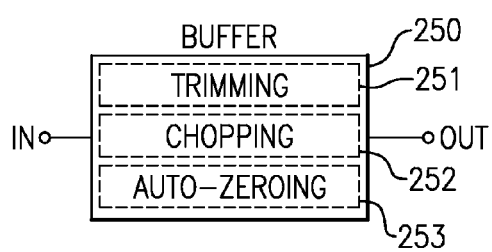
FIG. 5F is a circuit diagram of a buffer according to another embodiment.

FIG. 5F is a circuit diagram of a buffer 250 according to another embodiment. The buffer 250 of FIG. 5F includes a trimming circuit 251, a chopping circuit 252, and an auto-zeroing circuit 253. The buffer 250 further includes an input IN and an output OUT.

Including at least one of the trimming circuit 251, the chopping circuit 252, or the auto-zeroing circuit 253 can reduce an input offset voltage of the buffer 250. When the buffer 250 is used in a leakage current compensated circuit to reduce a voltage difference between an n-well (for example, the n-well 34 of FIG. 2A) and a p-well (for example, the first p-well 33a of FIG. 2A), the voltage difference after compensation can be about equal to the buffer's input offset voltage. Thus, including circuitry to reduce the buffer's input offset voltage can improve performance by decrease the voltage difference between the n-well and p-well after compensation.

Although FIG. 5F illustrates the buffer 250 as including the trimming circuit 251, the chopping circuit 252, and the auto-zeroing circuit 253, one or more of the circuits can be omitted. For example, the teachings herein are also applicable to a buffer that includes only the trimming circuit 251, only the chopping circuit 252, or only the auto-zeroing circuit 253.

The buffer 250 of FIG. 5F illustrates another example implementation of the buffer 51 shown in FIGS. 2A, 2B, and 3B. However, the buffer 51 of FIGS. 2A, 2B, and 3B can be implemented in a wide variety of ways.

While certain embodiments are illustrated in the context of a p-type semiconductor substrate, the principles and advantages described herein are also applicable to an n-type configuration where the doping polarities are reversed. For example, an n-type substrate can be provided rather than a p-type substrate, and wells and active areas of an opposite doping type can be provided in the n-type substrate. Furthermore, the implementations described herein can be applicable to undoped substrates, such as substrates used in certain SOI technologies.

Applications

Devices employing the above described schemes can be implemented into various high performance electronic devices and interface applications, such as interfaces associated with precision amplification. Examples of the electronic devices can include, but are not limited to, consumer electronic products, parts of the consumer electronic products, electronic test equipment, high robustness industrial equipment, automotive equipment, etc. The consumer electronic products can include, but are not limited to, an automobile, an engine control unit, a vehicle engine management controller, a transmission controller, a seatbelt controller, an anti-lock brake system controller, etc. Further, the electronic device can include unfinished products, including those for industrial and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit comprising:
a substrate;
an input node; and
a protection device formed in the substrate, the protection device comprising:
a first terminal electrically connected to the input node;
a first well of semiconductor electrically connected to the first terminal and comprising an n-type active region formed in the first well and a p-type active region formed in the first well;
a second well of semiconductor adjacent to the first well and comprising at least one active region formed in the second well, wherein the second well has a conductivity type opposite that of the first well; and
a leakage current compensation circuit configured to control a voltage level of the second well based on a voltage level of the first terminal to inhibit a leakage current of the first terminal of the protection device.

2. The integrated circuit of claim 1, further comprising a precision amplifier including a first input electrically connected to the input node of the integrated circuit and to the first terminal of the protection device.

3. The integrated circuit of claim 1, wherein the first well of semiconductor comprises a first p-type well and wherein the second well of semiconductor comprises an n-type well.

4. The integrated circuit of claim 3, wherein a junction between the n-type well and the first p-type well comprises a base-to-emitter junction of a PNP bipolar transistor, wherein the leakage current compensation circuit inhibits the leakage current of the first terminal of the protection device by controlling a voltage across the base-to-emitter junction.

5. The integrated circuit of claim 4, wherein the leakage current compensation circuit controls a voltage difference between the n-well and the first p-type well to be less than 700 mV.

6. The integrated circuit of claim 3, wherein the at least one active region formed in the second well comprises a first n-type active region that is electrically connected to an output of the leakage current compensation circuit, and wherein the p-type active region formed in the first well comprises a first p-type active region that is electrically connected to the first terminal and to an input of the leakage current compensation circuit.

7. The integrated circuit of claim 6, wherein the leakage current compensation circuit comprises a buffer circuit electrically connected between the input of the leakage current compensation circuit and the output of the leakage current compensation circuit.

8. The integrated circuit of claim 7, further comprising an input resistor electrically connected between an input of the buffer and the first terminal, wherein the input resistor has a resistance in the range of range of 10 k$\Omega$ and 100 M$\Omega$.

9. The integrated circuit of claim 7, further comprising an output resistor electrically connected between an output of the buffer and the first n-type active region, wherein the output resistor has a resistance in the range of range of 10 k$\Omega$ and 100 M$\Omega$.

10. The integrated circuit of claim 7, wherein the buffer circuit comprises at least one of a trimming circuit, a chopping circuit, or an auto-zero circuit to compensate for an input offset voltage of the buffer circuit.

11. The integrated circuit of claim 6, wherein the protection device further comprises:
a second p-type well, wherein at least a portion of the n-type well is positioned between the first p-type well and the second p-type well.

12. The integrated circuit of claim 11, wherein the protection device further comprises:
a second terminal; and
a second p-type active region in the second p-type well, wherein the second p-type active region is electrically connected to the second terminal.

13. The integrated circuit of claim 12, wherein the second terminal is electrically connected to a supply node of the integrated circuit.

14. The integrated circuit of claim 12, wherein the n-type active region formed in the first well comprises a second n-type active region that is electrically connected to the first terminal, wherein the protection device further comprises a third n-type active region in the second p-type well, wherein the third n-type active region is electrically connected to the second terminal.

15. The integrated circuit of claim 12, further comprising:
an insulator layer beneath the first p-type well, the second p-type well, and the n-type well; and
a support substrate beneath the insulator layer.

16. The integrated circuit of claim 12, wherein the first p-type well is implemented as a first island in the n-type well, and wherein the second p-type well is implemented as a second island in the n-type well.

17. The integrated circuit of claim 16, wherein the protection device further comprises a third p-type well surrounding a perimeter of the n-type well.

18. The integrated circuit of claim 16, wherein the protection device further comprises an n-type buried layer beneath the first p-type well, the second p-type well, and the n-well.

19. A method of electrical overstress protection, the method comprising:
protecting an input node of a precision amplifier from an overstress event using a protection device, the protection device comprising a first terminal electrically connected to the input node, a first well of semiconductor electrically connected to the first terminal, and a second well of semiconductor adjacent to the first well and of a conductivity type opposite that of the first well; and
inhibiting a leakage current of the first terminal of the protection device by controlling a voltage level of the second well based on a voltage level of the first terminal using a leakage current compensation circuit, thereby inhibiting the protection device from generating an input bias current of the precision amplifier.

20. An integrated circuit comprising:
a precision amplifier coupled to an input node of the integrated circuit; and
a protection device comprising:
a first terminal electrically connected to the input node;
a first well of semiconductor electrically connected to the first terminal;
a second well of semiconductor adjacent to the first well, wherein the second well has a conductivity type opposite that of the first well; and
an amplifier including an input electrically connected to the input node of the integrated circuit and an output configured to control a voltage level of the second well based on a voltage level of the first terminal to inhibit a leakage current of the first terminal of the protection device from generating an input bias current of the precision amplifier.

21. The integrated circuit of claim 20, wherein the precision amplifier is an instrumentation amplifier or an operational amplifier.

* * * * *

UNITED STATES PATENT AND TRADEMARK OFFICE
CERTIFICATE OF CORRECTION

PATENT NO. : 9,929,142 B2  
APPLICATION NO. : 14/638880  
DATED : March 27, 2018  
INVENTOR(S) : Evgueni Ivanov et al.

Page 1 of 1

It is certified that error appears in the above-identified patent and that said Letters Patent is hereby corrected as shown below:

In the Claims

In Column 18 at Line 33, In Claim 8, change "range of range of" to --range of--.

In Column 18 at Line 37, In Claim 9, change "range of range of" to --range of--.

Signed and Sealed this  
Nineteenth Day of June, 2018

Andrei Iancu  
*Director of the United States Patent and Trademark Office*